United States Patent
Hattori et al.

(10) Patent No.: US 7,781,958 B2
(45) Date of Patent: Aug. 24, 2010

(54) LIGHT EMITTING DEVICE

(75) Inventors: Yasushi Hattori, Kawasaki (JP); Shinji Saito, Yokohama (JP); Sinya Nunoue, Ichikawa (JP); Genichi Hatakoshi, Yokohama (JP); Koichi Tachibana, Kawasaki (JP); Naomi Shida, Minato-ku (JP); Iwao Mitsuishi, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 542 days.

(21) Appl. No.: 11/857,233

(22) Filed: Sep. 18, 2007

(65) Prior Publication Data

US 2008/0169752 A1 Jul. 17, 2008

(30) Foreign Application Priority Data

Jan. 16, 2007 (JP) ............................. 2007-007099

(51) Int. Cl.
*H05B 33/00* (2006.01)
*H01J 1/62* (2006.01)
*H01J 63/04* (2006.01)

(52) U.S. Cl. .................. 313/501; 313/512; 313/483; 257/98; 362/555; 362/800

(58) Field of Classification Search ......... 313/498–512, 313/482–487; 257/98–100; 362/555, 800
See application file for complete search history.

(56) References Cited

U.S. PATENT DOCUMENTS

| 7,040,774 | B2 * | 5/2006 | Beeson et al. ................. 362/84 |
| 7,279,719 | B2 * | 10/2007 | Suehiro et al. ................ 257/98 |
| 7,497,581 | B2 * | 3/2009 | Beeson et al. ................. 362/84 |
| 7,525,127 | B2 * | 4/2009 | Hattori et al. ................. 257/99 |
| 2006/0291246 | A1 | 12/2006 | Hattori |
| 2007/0001568 | A1 | 1/2007 | Kaneko et al. |

FOREIGN PATENT DOCUMENTS

| JP | 7-282609 | | 10/1995 |
| JP | 11053919 | A * | 2/1999 |
| JP | 2000315825 | A * | 11/2000 |
| JP | 2001345483 | A * | 12/2001 |
| JP | 2003179266 | A * | 6/2003 |
| JP | 2005-205195 | | 8/2005 |
| JP | 2006-210887 | | 8/2006 |
| JP | 2007142268 | A * | 6/2007 |
| WO | WO 02052615 | A2 * | 7/2002 |

* cited by examiner

*Primary Examiner*—Mariceli Santiago
(74) *Attorney, Agent, or Firm*—Oblon, Spivak, McClelland, Maier & Neustadt, L.L.P.

(57) ABSTRACT

A light emitting device includes a light emitting element emitting an excitation light and a fluorescent element. The fluorescent element includes a semi-translucent film facing the light emitting element, and transmits the excitation light; a first luminescent film including phosphors to absorb the excitation light transmitted through the semi-translucent film and to emit a visible light having a different wavelength than the excitation light; and a reflection film disposed on an opposite side of the first luminescent film on which the semi-translucent film is disposed, reflecting the excitation light transmitted through the first luminescent film towards the first luminescent film.

19 Claims, 13 Drawing Sheets

LIGHT EMITTING DEVICE

CROSS REFERENCE TO RELATED APPLICATIONS AND INCORPORATION BY REFERENCE

This application is based upon and claims the benefit of priority from prior Japanese Patent Application P2007-7099 filed on Jan. 16, 2007; the entire contents of which are incorporated by reference herein.

BACKGROUND OF THE INVENTION

1. Field of the Invention

The present invention relates to a light emitting device, and more particularly relates to a light emitting device including a semiconductor light emitting element and phosphors for emitting a light having a different wavelength from the light emitted from the semiconductor light emitting element.

2. Description of the Related Art

Light source devices or light emitting devices in which a semiconductor light emitting element and a fluorescent element are combined (refer to JP-A 2005-205195 (KOKAI), JP-A H07-282609 (KOKAI), and JP-A 2006-210887 (KOKAI)) are known. The fluorescent element absorbs an excitation light emitted from the semiconductor light emitting element and emits a light having a different wavelength from the excitation light.

In JP-A 2005-205195, a light emitting device having a high luminance and a high color rendering characteristic is described. In the light emitting device, an optical fiber is used as a waveguide for an excitation light and a fluorescent element is attached to the tip of the optical fiber.

Also, in JP-A H07-282609, a durable and safe light emitting device having low electric power consumption is proposed. Further, the light emitting device can provide a very suitable illumination light, such as a white light, having a sufficient output power. The light emitting device includes a semiconductor laser diode emitting a laser light, a lens diffusing the laser light from the semiconductor laser, and a fluorescent element converting the laser light to a visible light.

Moreover, in JP-A 2006-210887, a light emitting device, which includes a semiconductor light emitting device emitting an excitation light for phosphors and a dispersing element of the phosphors, having a high light extraction efficiency is proposed. In the light emitting device, a radiated visible light from the phosphors of the dispersing element is extracted from the incident side of the excitation light in the dispersing element.

However, in the earlier light emitting devices described in the foregoing patent documents, the following points have not been considered. In the light emitting device of JP-A 2005-205195, the emitting direction of the light from the light emitting element and the radiating direction of the light from the fluorescent element are identical. Even in the light emitting device of JP-A H07-282609, the output direction of the laser light of the semiconductor laser diode, the diffusion direction of the light of the diffusing lens, and the radiating direction of the light from the fluorescent element are identical. Also, even in JP-A 2006-210887, the light emitting device has a structure in which a part of the excitation lights scattered by the phosphors of the dispersing element may be emitted from the incident side of the excitation light with the visible light. Thus, it is insufficient to suppress the short wavelength light scattered by the phosphors of the dispersing element.

Accordingly, due to the leakage of the excitation light emitted from a light emitting diode or a semiconductor laser diode, it is not desirable to use the light emitting element which radiates a high energy light, such as an ultraviolet light and a laser light, because it is dangerous to view directly. Also, in order to decrease the leakage of the excitation light in such structures, it is necessary to decrease the output power of the semiconductor light emitting element, or to increase the thickness of the fluorescent element. As a result, the efficiency of the light emitting device decreases.

Also, it is required that the light emitting device shall maintain the output power of the semiconductor light emitting element constant. However, when the output power of the light emitting element is changed, the excitation magnitude of the phosphors may be changed. Also, spectrum of the extracted light intensity with regards to the wavelength may be changed. Therefore, there is a problem that the color tone of the light obtained from the light emitting device is changed. Thus, in the earlier light emitting devices, it is substantially difficult to adjust the quantity of the light.

Moreover, it is not desirable to use the light emitting element radiating a high energy light for a light emitting device. Thus, it is difficult to apply the light emitting device to a lighting apparatus, an image display and the like, in which a high luminance is required.

SUMMARY OF THE INVENTION

An aspect of the present invention inheres in a light emitting device including a light emitting element configured to emit an excitation light; and a fluorescent element including: a semi-translucent film facing the light emitting element, and configured to transmit the excitation light; a first luminescent film including a plurality of phosphors configured to absorb the excitation light transmitted through the semi-translucent film and to emit a visible light having a different wavelength than the excitation light; and a reflection film disposed on an opposite side of the first luminescent film on which the semi-translucent film is disposed, configured to reflect the excitation light transmitted through the first luminescent film towards the first luminescent film.

DETAILED DESCRIPTION OF THE INVENTION

Figure 1:
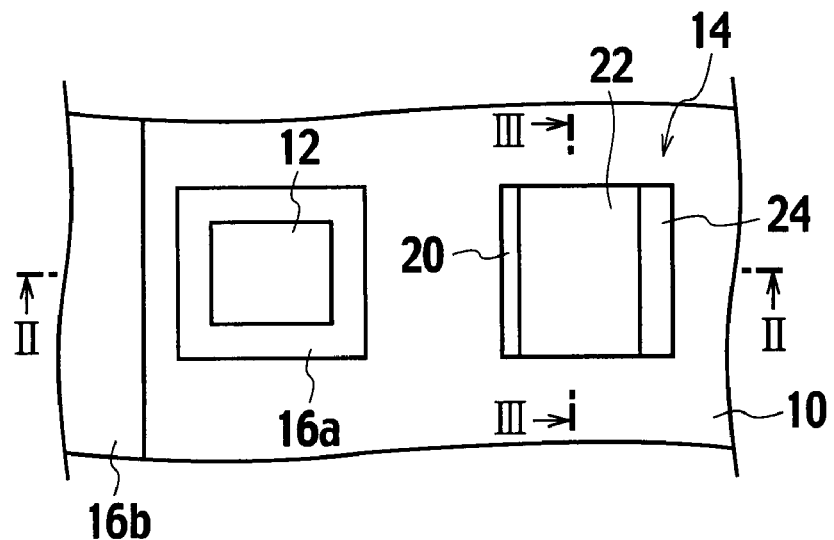
FIG. 1 is a plan view showing an example of a light emitting device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
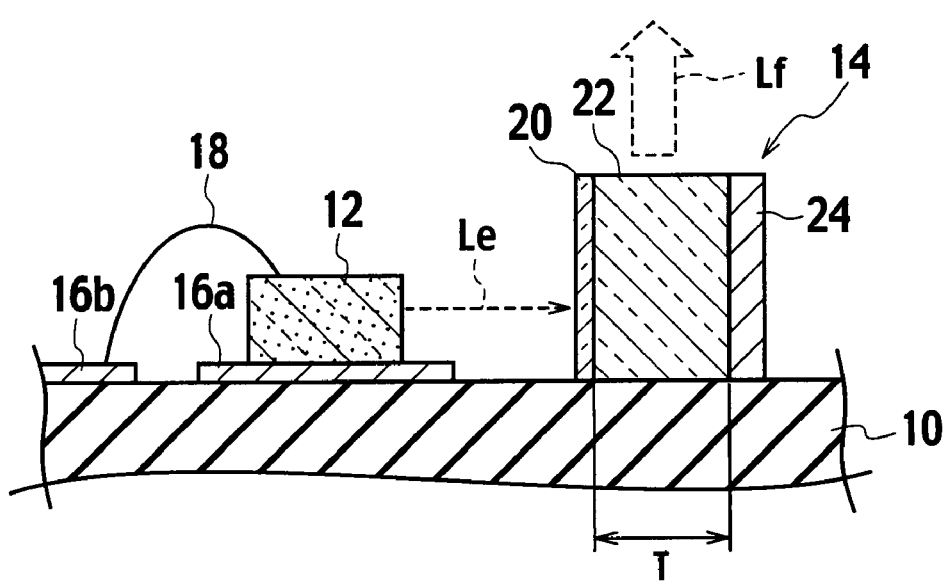
FIG. 2 is a cross sectional view taken on line II-II of the light emitting device shown in FIG. 1.

A light emitting device according to an embodiment of the present invention includes a light emitting element 12 and an fluorescent element 14 disposed on a mounting substrate 10, as shown in FIGS. 1 and 2. The fluorescent element 14 includes a semi-translucent film 20, a luminescent film 22, a reflection film 24 and the like. The reflection film 24 is disposed on an opposite side of the luminescent film 22 on which the semi-translucent film 20 is disposed. The mounting substrate 10 has wirings 16a, 16b. Electrodes (not shown) of the light emitting element 12 are electrically connected to the wirings 16a, 16b, directly and through a bonding wire 18, respectively.

As shown in FIG. 2, the light emitting element 12 irradiates an excitation light Le in a wavelength range between an ultraviolet light and a visible light to the fluorescent element 14. The fluorescent element 14 is disposed so that the semi-translucent film 20 faces the light emitting element 12. The incident excitation light Le penetrates the semi-translucent film 20 into the luminescent film 22. A part of the excitation light Le penetrates the luminescent film 22 and is reflected in a different direction, from the incident direction of the excitation light Le, by the reflection film 24. The luminescent film 22 absorbs the transmitted excitation light through the semi-translucent film 20 and the reflected excitation light by the reflection film 24, so as to radiate a visible light, having a different wavelength from the excitation light, in all direction. The radiated visible light is emitted from the luminescent film 22, to the outside, as a visible output light Lf.

Figure 3:
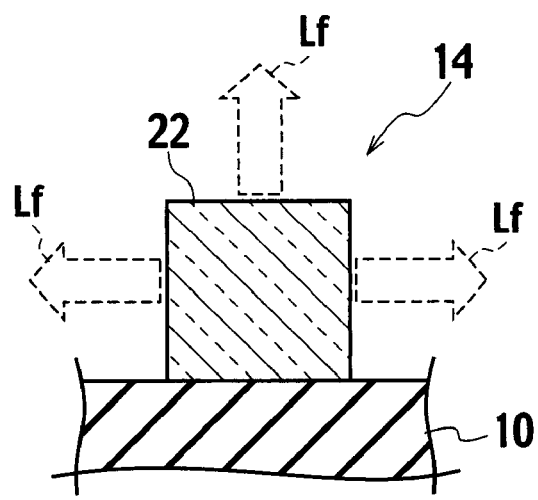
FIG. 3 is a cross sectional view taken on line III-III of the light emitting device shown in FIG. 1.

The visible light radiated in the luminescent film 22 towards the reflection film 24 is reflected by the reflection film 24. Additionally, a part of the visible light radiated towards the semi-translucent film 20 does not penetrate the semi-translucent film 20 and is reflected by the difference of the refractive index between the semi-translucent film 20 and air. Thus, as shown in FIG. 3, the visible output light Lf is mainly emitted from side surfaces of the luminescent film 22 in a perpendicular direction to the incident direction of the excitation light Le.

Figure 4:
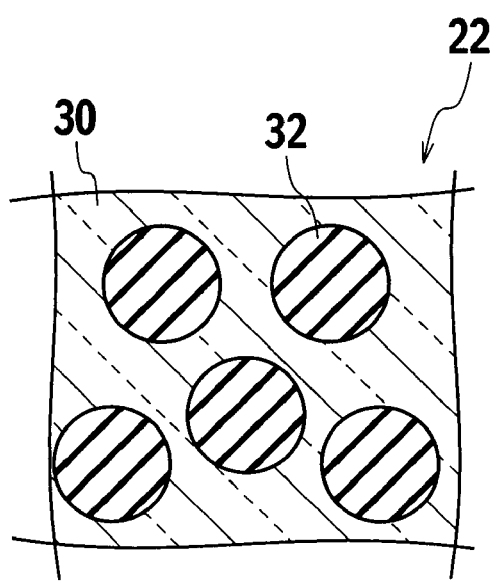
FIG. 4 is a cross sectional view showing an example of an fluorescent element according to the embodiment of the present invention.

As shown in FIG. 4, the luminescent film 22 includes a transparent base material 30 which is transparent with respect to the excitation light and phosphors 32 dispersed in the transparent base material 30. The incident excitation light in the luminescent film 22 is absorbed by the phosphors 32. A part of the excitation light, which is not absorbed by the phosphors 32, penetrates the transparent base material 30 and is transmitted towards the reflection film 24. The transmitted excitation light is reflected to the luminescent film 22 by the reflection film 24 to be absorbed by the phosphors 32. A part of the reflected excitation light penetrates the transparent base material 30 and the semi-translucent film 20, and is transmitted outside of the fluorescent element 14 towards the light emitting element 12. However, the excitation light will not leak through the reflection film 24 to the outside. Also, there is no substantial leakage of the excitation light, in the direction in which the visible output light is mainly emitted.

The content of the phosphors 32 is adjusted such that the incident excitation light from the light emitting element 12 can be effectively absorbed. Specifically, the luminescent film 22 may include a content of the phosphors 32 of about 20 weight % or more, desirably about 50 weight % or more in the transparent base material 30. Also, regarding the phosphors 32, a large particle phosphor material having a particle diameter, for example, of about 20 nm or more, which can provide high light emission intensity and high luminous efficiency, may be used.

Figure 5:
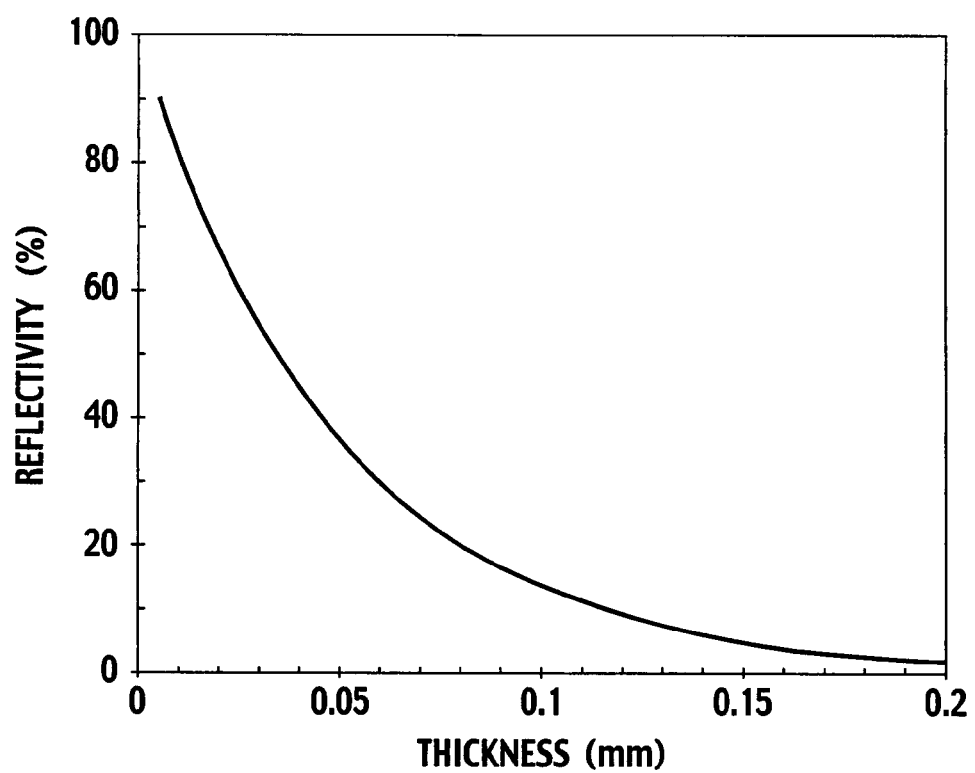
FIG. 5 is a graph showing an example of a relation of reflectivity of the semi-translucent film and thickness of the fluorescent element according to the embodiment of the present invention.

Moreover, reflectivity of the semi-translucent film 20 is adjusted such that the incident excitation light Le from the light emitting element 12 enters the semi-translucent film 20 and is not emitted externally therefrom. FIG. 5 shows a relationship between the thickness of the luminescent film 22 and optimal reflectivity of the semi-translucent film 20 in which the leakage of the excitation light can be suppressed and the luminous efficiency of the fluorescent element 14 can be increased, when the transmission rate of the luminescent film 22 to the excitation light is about 37%. For example, when the thickness of the luminescent film 22 is about 0.1 mm, by providing a reflectivity of about 14% for the semi-translucent film 20, it is possible to suppress the leakage of the excitation light from the semi-translucent film 20 and to increase the luminous efficiency of the fluorescent element 14.

Thus, even if the emitted excitation light Le is highly energized by the light emitting element 12, since leakage of the excitation light entering the fluorescent element 14 is suppressed, it is possible to use the light emitting device safely. Also, since the excitation light is confined inside the fluorescent element 14, the absorption of the excitation light in the luminescent film 22 increases. As a result, it is possible to emit an externally visible light, which has high luminance, from the fluorescent element 14.

A light emitting element having a light emission peak in a wavelength range of about 430 nm or less, between blue and ultraviolet, may be used for the light emitting element 12. The light emitting element 12 may be an edge emitting type or a surface emitting type. Specifically, for the light emitting element 12, a semiconductor laser diode (LD) or a light emitting diode (LED), which has an aluminum gallium indium nitride (AlGaInN) layer of a group III-V compound, or a magnesium zinc oxide (MgZnO) layer of a group II-VI compound as a light emitting layer (active layer), may be used.

For example, the group III-V compound semiconductor used as the active layer may be a nitride based compound semiconductor including at least one of Al, Ga and In. Specifically, the III-V group compound semiconductor, used as the active layer, can be represented as $Al_xGa_yIn_{(1-x-y)}N$ ($0 \leq x \leq 1$, $0 \leq y \leq 1$, $0 \leq (x+y) \leq 1$) which includes a binary nitride semiconductor, such as AlN, GaN and InN, a ternary nitride semiconductor, such as $Al_xGa_{(1-x)}N$ ($0<x<1$), $Al_xIn_{(1-x)}N$ ($0<x<1$) and $Ga_yIn_{(1-y)}N$ ($0<y<1$), and a quaternary nitride semiconductor containing all of Al, Ga and In. The light emission peak wavelength in a range between ultraviolet and blue is determined in accordance with the composition of x, y and (1-x-y) with regard to Al, Ga and In, respectively. Additionally, a part of the group III element may be replaced with boron (B), thallium (Tl) and the like. Also, a part of the group V element maybe replaced with phosphorus (P), arsenic (As), antimony (Sb), bismuth (Bi) and the like.

Similarly, the group II-VI compound semiconductor used as the active layer is an oxide semiconductor including at least one of Mg and Zn. Specifically, the group II-VI compound semiconductor, used as the active layer, can be represented as $Mg_zZn_{(1-z)}O$ ($0 \leq z \leq 1$). The light emission peak wavelength of the ultraviolet region is determined in accordance with the composition of z and (1-z) with regard to Mg and Zn, respectively.

Figure 6:
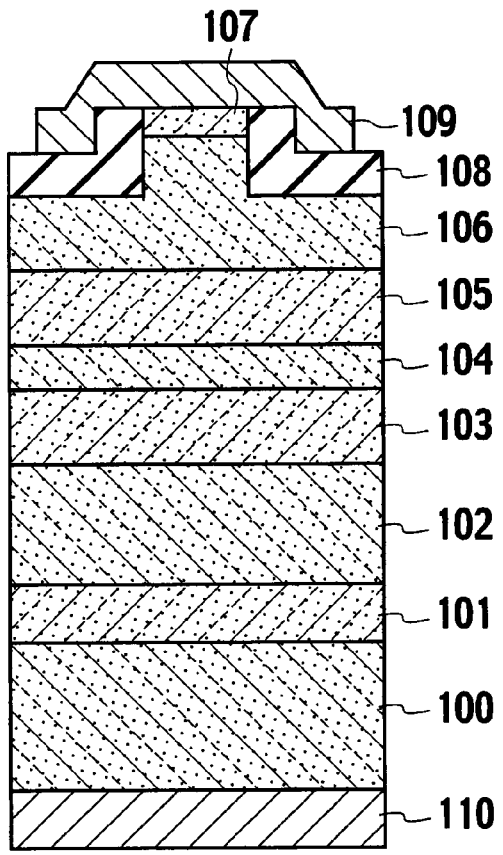
FIG. 6 is a cross sectional view showing an example of a light emitting element used in the light emitting device according to the embodiment of the present invention.

FIG. 6 shows an example of an edge emitting AlGaInN-based laser diode used as the light emitting element 12. As shown in FIG. 6, the AlGaInN-based laser diode includes a n-type GaN substrate 100 and an epitaxial growth layers grown on the substrate 100. The epitaxial growth layers include a n-type GaN buffer layer 101, a n-type AlGaN clad layer 102, a n-type GaN optical guide layer 103, a GaInN active layer 104, a p-type GaN optical guide layer 105, a p-type AlGaN clad layer 106 and a p-type GaN contact layer 107. The p-type contact layer 107 and a part of the p-type clad layer 106 provide a ridge. An insulating film 108 is provided on a side surface of the ridge and a front surface of the p-type clad layer 106. A p-side electrode 109 is provided on a front surface of the p-type contact layer 107 and a part of the insulating film 108. A n-type electrode 110 is provided on a back surface of the n-type substrate 100.

Figure 7:
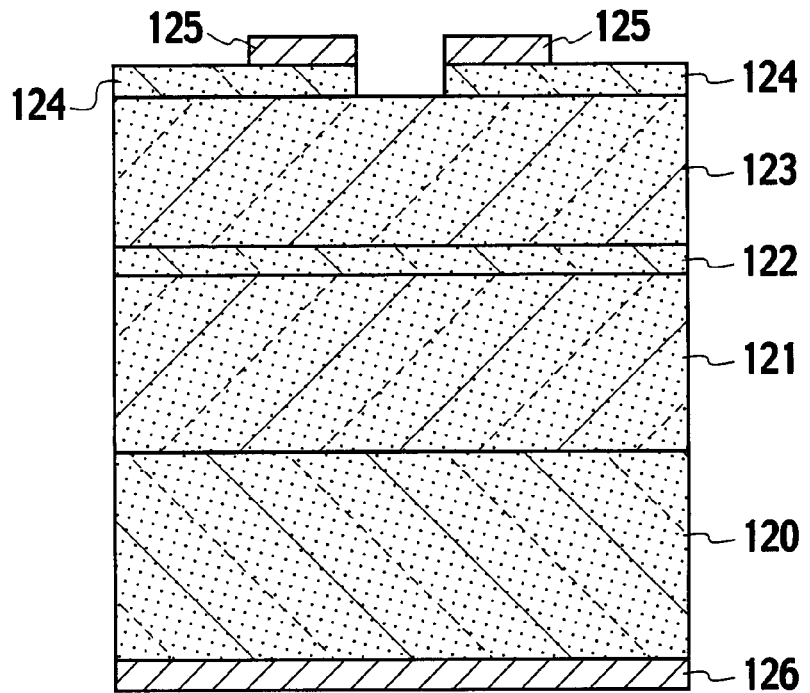
FIG. 7 is a cross sectional view showing another example of a light emitting element used in the light emitting device according to the embodiment of the present invention.

FIG. 7 shows an example of a vertical cavity surface emitting laser diode (VCSEL) used as the light emitting element 12. As shown in FIG. 7, the VCSEL has a structure which includes a n-type distributed Bragg reflector (DBR) mirror 121 having multiple layers, a multiple quantum well (MQW) layer 122 and a p-type DBR mirror 123 having multiple layers on a n-type substrate 120. A p-side electrode 125 is provided through a contact layer 124 on the p-type DBR mirror 123. A n-side electrode 126 is provided on a back surface of the n-type substrate 120.

Figure 8:
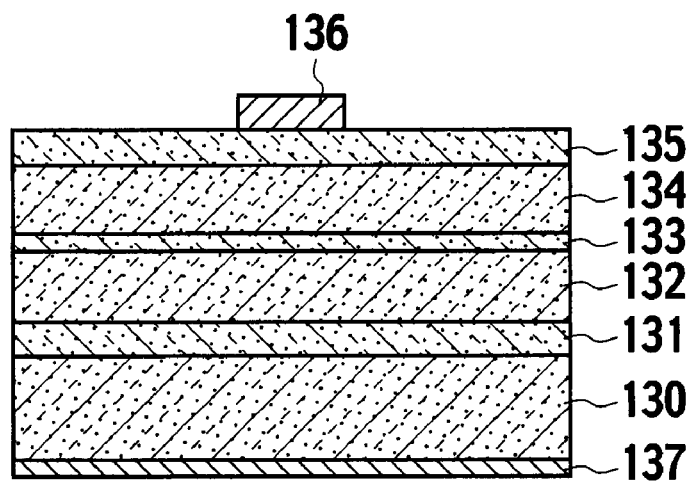
FIG. 8 is a cross sectional view showing another example of a light emitting element used in the light emitting device according to the embodiment of the present invention.
Figure 9:
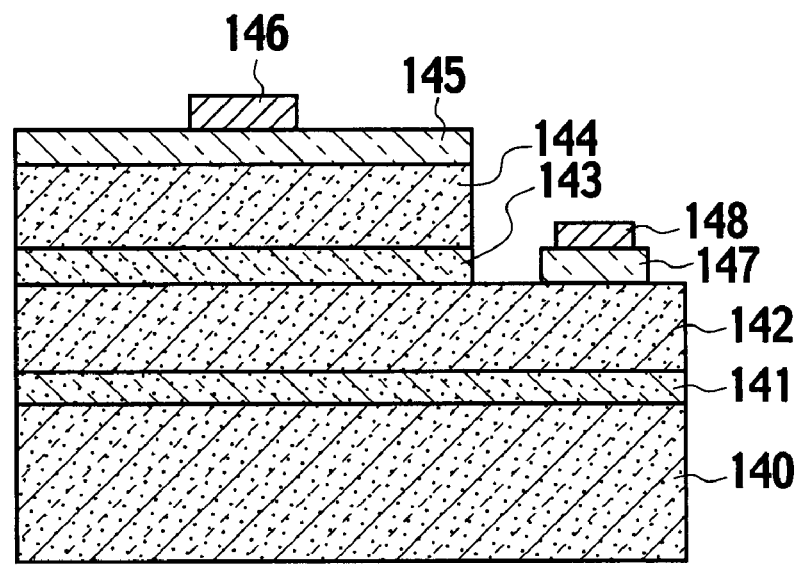
FIG. 9 is a cross sectional view showing another example of a light emitting element used in the light emitting device according to the embodiment of the present invention.

FIGS. 8 and 9 show examples of an edge emitting MgZnO laser diode used as the light emitting element 12. In the MgZnO laser diode shown in FIG. 8, a silicon (Si) substrate 130 is used. On the other hand, in the MgZnO laser diode shown in FIG. 9, a sapphire substrate 140 is used.

The MgZnO laser light shown in FIG. 8 has a structure which includes the Si substrate 130, a metal reflection layer 131, a p-type MgZnO clad layer 132, an i-type MgZnO active layer 133, a n-type MgZnO clad layer 134 and a n-type MgZnO contact layer 135. A n-side electrode 136 is provided on the n-type contact layer 135. A p-side electrode 137 is provided on the substrate 130.

The MgZnO laser diode shown in FIG. 9 has a structure which includes a sapphire substrate 140, a ZnO buffer layer 141, a p-type MgZnO clad layer 142, a MgZnO active layer 143 and a n-type MgZnO clad layer 144. A n-side electrode 146 is provided through an indium tin oxide (ITO) electrode layer 145 on the n-type clad layer 144. A p-side electrode 148 is provided through an ITO electrode layer 147 on the p-type clad layer 142.

For the semi-translucent film 20 of the fluorescent element 14, a metal thin film, a dielectric multi-layer film and the like may be used. For the metal thin film, a metal such as aluminum (Al), gold (Au), silver (Ag) and palladium (Pd), may be used. For each layer of the dielectric multi-layer film, an oxide film or a nitride film of Si, zirconium (Zr), hafnium (Hf), Al, tantalum (Ta), titanium (Ti) and the like may be used.

For the transparent base material 30 of the luminescent film 22, any material having a high transmission property of the excitation light and a high heat resistance may be used. For example, a resin such as silicone resin, epoxy resin, urea resin, fluorine resin, acryl resin and polyimide resin may be used. In particular, the epoxy resin and the silicone resin, which are easily available, easy to use and cheap, are desirable. Also, other than resin, glass, sintered body and ceramic structures combined with yttrium aluminum garnet (YAG) and alumina ($Al_2O_3$) and the like may be used.

For the phosphors 32, a phosphor material which emits a visible light by absorbing the light in the wavelength region between ultraviolet and blue may be used. For example, a phosphor material, such as a silicate phosphor material, an aluminate phosphor material, a nitride phosphor material, a sulfide phosphor material, a oxysulfide phosphor material, a YAG phosphor material, a borate phosphor material, a phosphate borate phosphor material, a phosphate phosphor material and a halophosphate phosphor material may be used.

(1) Silicate phosphor material: $(Sr_{(1-x-y-z)}Ba_xCa_yEu_z)_2 Si_wO_{(2+2w)}$ ($0 \leq x<1$, $0 \leq y<1$, $0.05 \leq z \leq 0.2$, $0.90 \leq w \leq 1.10$).

Here, for the silicate phosphor material, a composition of x=0.19, y=0, z=0.05 and w=1.0 is desirable. In the silicate phosphor material, in order to stabilize the crystal structure or to increase an emission intensity, a part of strontium (Sr), barium (Ba) and calcium (Ca) may be replaced with at least any one of Mg and Zn.

Additionally, the silicate phosphor material having a different composition ratio, such as $MSiO_3$, $MSiO_4$, $M_2SiO_3$, $M_2SiO_5$ and $M_4Si_2O_8$ (M is at least one element selected from Sr, Ba, Ca, Mg, Be, Zn and Y), may be used. Moreover, in the silicate phosphor material, in order to control an emission color, a part of Si may be replaced with germanium (Ge) (for example, $(Sr_{(1-x-y-z)}Ba_xCa_yEu_2)_2 (Si_{(1-u)}Ge_u)O_4)$. Also, at least one element selected from Ti, lead (Pb), manganese (Mn), arsenic (As), Al, praseodymium (Pr), terbium (Tb) and cerium (Ce) may be included as an activator.

(2) Aluminate phosphor material: $M_2Al_{10}O_{17}$ (note that M is at least one element selected from Ba, Sr, Mg, Zn and Ca).

As an activator, at least one of europium (Eu) and Mn may be included.

Additionally, the aluminate phosphor material having a different composition ratio, such as $MAl_2O_4$, $MAl_4O_{17}$, $MAl_8O_{13}$, $MAl_{12}O_{19}$, $M_2Al_{10}O_{17}$, $M_2Al_{11}O_{19}$, $M_3Al_5O_{12}$, $M_3Al_{16}O_{27}$ and $M_4Al_5O_{12}$ (M is at least one element selected from Ba, Sr, Ca, Mg, Be and Zn), may be used. Also, at least one element selected from Mn, dysprosium (Dy), Tb, neodymium (Nd) and Ce may be included as an activator.

(3) Nitride phosphor material (mainly, silicon nitride phosphor material) : $L_xSi_yN_{(2x/3+4y/3)}$: Eu, or $L_xSi_yO_zN_{(2x/3+4y/3-2z/3)}$: Eu (L is at least one element selected from Sr, Ca, Sr and Ca)

For the nitride phosphor material, a composition of x=2 and y=5, or x=1 and y=7 is desirable. However, x and y may be any values.

Specifically, the nitride phosphor material, such as $(Sr_xCa_{(1-x)})_2Si_5N_8$: Eu, $Sr_2Si_5N_8$: Eu, $Ca_2Si_5N_8$: Eu $Sr_xCa_{(1-x)}Si_7N_{10}$: Eu, $SrSi_7N_{10}$: Eu, $CaSi_7N_{10}$: Eu, in which Mn is added as an activator, may be desirable. At least one element selected from Mg, Sr, Ca, Ba, Zn, B, Al, copper (Cu), Mn, chrome (Cr) and nickel (Ni) may be included in the nitride phosphor materials. Also, at least one element selected from Ce, Pr, Tb, Nd and lanthanum (La) may be included as an activator.

(4) Sulfide phosphor material: $(Zn_{(1-x)}Cd_x)S$: M $(0 \leq x \leq 1)$, (M is at least one element selected from Cu, chlorine (Cl), Ag, Al, iron (Fe), Cu, Ni and Zn).

Sulfur (S) maybe replaced with at least anyone of selenium (Se) and tellurium (Te).

(5) Oxysulfide phosphor material: $(Ln_{(1-x)}Eu_x)$ $O_2S$ $(0 \leq x \leq 1)$, (Ln is at least one element selected from scandium (Sc), Y, La, gadolinium (Gd) and lutetium (Lu)).

At least any one of Tb, Pr, Mg, Ti, Nb, Ta, Ga, samarium (Sm) and thulium (Tm) may be used as an activator.

(6) YAG phosphor material: $(Y_{(1-x-y-z)}Gd_xLa_ySm_z)_3 (Al_{(1-v)}Ga_v)_5O_{12}$: Ce, Eu $(0 \leq x \leq 1, 0 \leq y \leq 1, 0 \leq z \leq 1, 0 \leq v \leq 1)$.

At least one of Cr and Tb may be included as an activator.

(7) Borate phosphor material: $MBO_3$: Eu (M is at least one element selected from Y, La, Gd, Lu and In).

Tb may be included as an activator.

Additionally, the borate phosphor material having a different composition ratio, such as $Cd_2B_2O_5$: Mn, (Ce, Gd, Tb) $MgB_5O_{10}$: Mn, $GdMgB_5O_{10}$: Ce, Tb may be used.

(8) Phosphate borate phosphor material: $2(M_{(1-x)}M'_x)O \cdot aP_2O_5 \cdot bB_2O_3$ $(0.01 \leq x \leq 0.5, 0 \leq a \leq 2, 0 \leq b \leq 3, 0.3 < (a+b))$, (M is at least one element selected from Mg, Ca, Sr, Ba and Zn, and M' is at least one element selected from Eu, Mn, Sn, Fe and Cr,).

(9) Phosphate phosphor material: $(Sr_{(1-x)}Ba_x)_3 (PO_4)_2$: Eu, or $(Sr_{(1-x)}Ba_x)_2P_2O_7$: Eu, Sn.

Any one of Ti and Cu may be included as an activator.

(10) Halphosphate-based phosphor material: $(M_{(1-x)}Eu_x)_{10}(PO_4)_6Cl_2$, or $(M_{(1-x)}Eu_x)_5 (PO_4)_3Cl$ (M is at least one element selected from Ba, Sr, Ca, Mg and Cd, and x is a number satisfying the inequality $0 \leq x \leq 1$).

At least a part of Cl may be replaced with fluorine (F). Also, at least one of Sb and Mn may be included as an activator.

By arbitrarily selecting the foregoing phosphor materials, it is possible to provide a blue fluorescent element, a yellow fluorescent element, a green fluorescent element, a red fluorescent element and a white fluorescent element for the fluorescent element 14. Also, by combining a plurality of phosphor materials, it is possible to provide the fluorescent element 14 which emits a light of an additive color generated from colors of the phosphor materials. For providing a white fluorescent element, a combination of respective phosphor materials corresponding to three primary colors of light of red, green and blue (RGB), or a combination of colors under the complementary color relation, such as blue and yellow, may be used.

For example, a phosphor material of each color corresponding to each of RGB is mixed in each transparent base material so as to fabricate thin fluorescent films corresponding to respective colors of RGB. By laminating the thin fluorescent films with each other, a multi-layer fluorescent film, which emits a white light, may be provided as the luminescent film 22 shown in FIG. 1. Also, by mixing phosphor materials of RGB in a single transparent base material, a single-layered fluorescent film, which emits a white light, may be provided as the luminescent film 22. When stability of efficiency and color tone is required for the luminescent film 22, the multi-layer fluorescent film may be desirable. When putting weight on simple fabrication of the luminescent film 22, a single-layered fluorescent film may be desirable.

For the reflection film 24, it is possible to use a metal film or a dielectric multi-layer DBR having reflectivity of about eighty %  or more, desirably, about 90% or more, for the excitation light. In particular, for the dielectric multi-layer DBR, it is possible to provide a design in conformity with a wavelength of the excitation light so as selectively reflect only the excitation light and to transmit the visible light emitted from the luminescent film 22. For the metal film, metals such as Al, Au, Ag, and Pd, which have high reflectivity, may be used. For the dielectric multi-layer DBR, an oxide and a nitride of Si, Zr, Hf, Al, Ta, Ti and the like may be used.

For the mounting substrate 10, it is desirable to use a material having a high thermal conductivity. For example, AlN, $Al_2O_3$, Cu, nitride boron (BN), plastic, ceramics, diamond and the like may be used. Using such materials for the mounting substrate 10 can efficiently remove the heat generated by the operation of the light emitting element 12.

For the wirings 16a, 16b, a material having low resistance and a low absorption rate of the visible light is desirable. For example, the wirings 16a, 16b can be formed by using a metal material, such as Au, Ag, Cu, Cu alloy, and tungsten (W). The wirings 16a, 16b may be thin film wirings or thick film wirings. Moreover, Au plating layers, Ag plating layers, Pd plating layers, or soldering plating layers can be formed on the wirings 16a, 16b, in order to improve the bondability. It is desirable to use a material having low resistance and low absorption rate of the visible light for the bonding wire 18. For example, an Au wire can be used. Alternately, a wire in which Au and a noble metal, such as Pt, are combined may be used.

A method for manufacturing a light emitting device according to the embodiment of the present invention will be described below by exemplifying the light emitting device shown in FIGS. 1 and 2.

A fluorescent element 14 of the light emitting device shown in FIG. 1 is formed. A silicone resin is used as a transparent base material of a fluorescent film. Two fluorescent films including different phosphor materials, which provide the white light by using a complementary color relationship, in the transparent materials, are formed. Each fluorescent film includes about 75% by weight of each different phosphor material. For example, a blue fluorescent film including blue phosphor materials and a yellow fluorescent film including yellow phosphor materials are respectively formed. Specifically, $(Sr, Ca, Ba)_{10} (PO_4)_6 Cl_2$: Eu is used for the blue phosphor material, and $3(Sr, Ca, Ba)_2 Si_2 O_4$: Eu is used for the yellow phosphor material, respectively.

A dielectric multi-layer film, which includes a $Si_3N_4$ film, is prepared for a semi-translucent film 20. The yellow fluorescent film is laminated on the dielectric multi-layer film. Moreover, the blue fluorescent film is laminated on the yellow fluorescent film. Thus, a luminescent film 22 having yellow and blue fluorescent films is formed.

In addition, a blue visible light may be absorbed in the yellow fluorescent film so as to emit a yellow visible light. Thus, the color tone may be changed. On the other hand, a yellow visible light may not be absorbed in the blue fluorescent film. Hence, in order to prevent the blue visible light radiated in the blue fluorescent film from being emitted into the yellow fluorescent film, it is desirable to make the refractive index of the blue fluorescent film larger than the yellow fluorescent film. Additionally, by disposing the yellow fluorescent film of the low refractive index in the entrance side of the excitation light, it is possible to efficiently transmit the excitation light to the entire luminescent film 22.

A metal film, such as Ag, is deposited on the luminescent film 22 by evaporation, sputtering and the like, to form a reflection film 24. Thus, a fluorescent element 14 is fabricated.

A mounting substrate 10, such as AlN, is fabricated by molding. A metal film, such as Au, is deposited on the mounting substrate 10. Wirings 16a, 16b are formed on the surface of the mounting substrate 10 by photolithography, etching and the like.

A semiconductor laser diode, as a light emitting element 12, which has an AlGaInN active layer to excite a purple light, is mounted on the mounting substrate 10 so as to directly connect an electrode (not shown) of the light emitting element 12 to the wiring 16a. The fluorescent element 14 is mounted on the surface of the mounting substrate 10 so that the semi-translucent film 20 faces the light emitting element 12. Thereafter, the wiring 16b and the other electrode (not shown) of the light emitting element 12 are electrically connected by a bonding wire 18.

In the light emitting device manufactured as mentioned above, an operating voltage is applied between the electrodes of the light emitting element 12, so as to excite the laser light. The excitation light emitted in the direction of the fluorescent element 14, from the light emitting element 12, irradiates the semi-translucent film 20. The excitation light incident to the semi-translucent film 20 is absorbed in the luminescent film 22. Then, a white light is transmitted in a direction different from the incident direction of the excitation light.

The excitation light transmitted through the luminescent film 22 is reflected by the reflection film 24. The reflected excitation light reenters the luminescent film 22 to be absorbed in the luminescent film 22. Thus, the high energy excitation light does not leak through the reflection film 24.

Also, by adjusting the reflectivity of the semi-translucent film 20, it is possible to decrease the excitation light transmitted through the semi-translucent film 20 to the outside of the fluorescent element 14. As a result, the high energy excitation light does not substantially leak to the output direction of the visible output light. Thus, in the embodiment of the present invention, safe use of the high energy excitation light to radiate the visible light with high luminance is possible.

Figure 10:
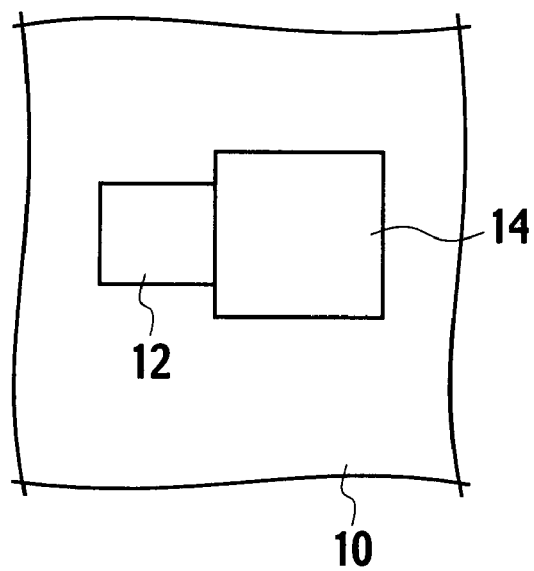
FIG. 10 is a plan view showing another example of a light emitting device according to the embodiment of the present invention.

In addition, in the light emitting device shown in FIG. 1, the light emitting element 12 and the fluorescent element 14 are separated from each other. The distance between the light emitting element 12 and the fluorescent element 14 is arbitrary and may be determined by considering the expansion of the incident excitation light spot on the fluorescent element 14 and heat dissipation of the light emitting device. For example, when the heat dissipation efficiency of the mounting substrate 10 is sufficient, the exit side of the light emitting element 12 may be in close contact with the entrance side of the fluorescent element 14, as shown in FIG. 10. In this case, since the expansion of the excitation light can be ignored, the leakage of the excitation light can be efficiently decreased.

Figure 11:
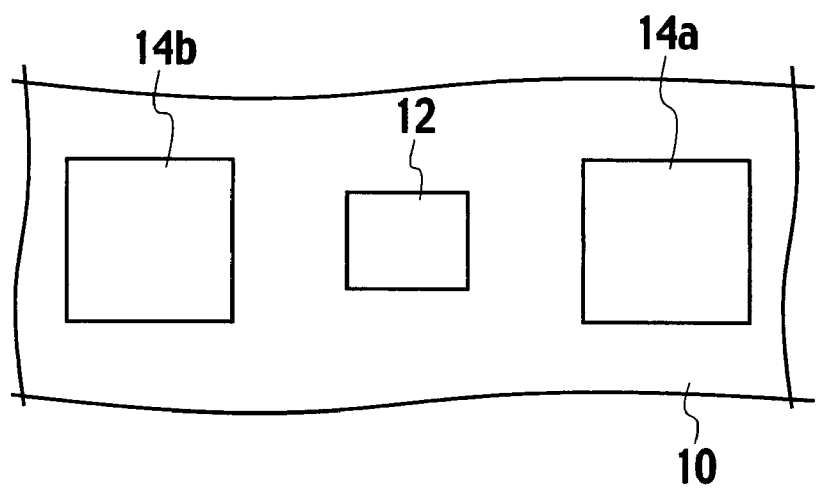
FIG. 11 is a plan view showing another example of a light emitting device according to the embodiment of the present invention.

Also, when the light emitting element 12 of an edge emission type is used, it is possible to emit the excitation light from both ends opposite to each other. In this case, as shown in FIG. 11, two fluorescent elements 14a, 14b may be disposed so as to face each of both ends from which the excitation light is emitted.

Figure 12:
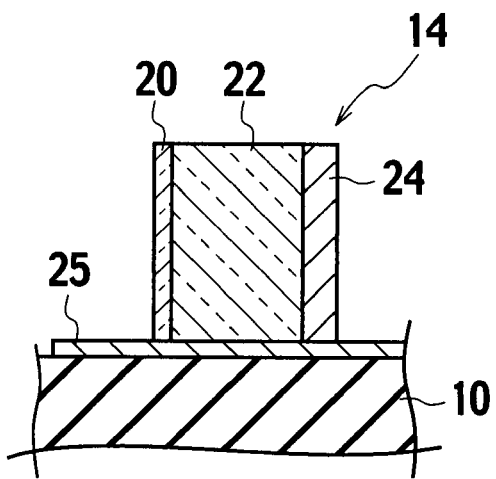
FIG. 12 is a cross sectional view showing another example of an fluorescent element according to the embodiment of the present invention.

Also, as shown in FIG. 12, a reflection film 25, such as a metal film, may be formed on the surface of the mounting substrate 10 on which the fluorescent element 14 is placed. Among the visible lights radiated inside the luminescent film 22 in all directions, the visible light radiated in a direction towards the mounting substrate 10 is reflected by the reflecting film 25. As a result, the extraction efficiency of the visible light radiated in the fluorescent element 14 is increased.

Figure 13:
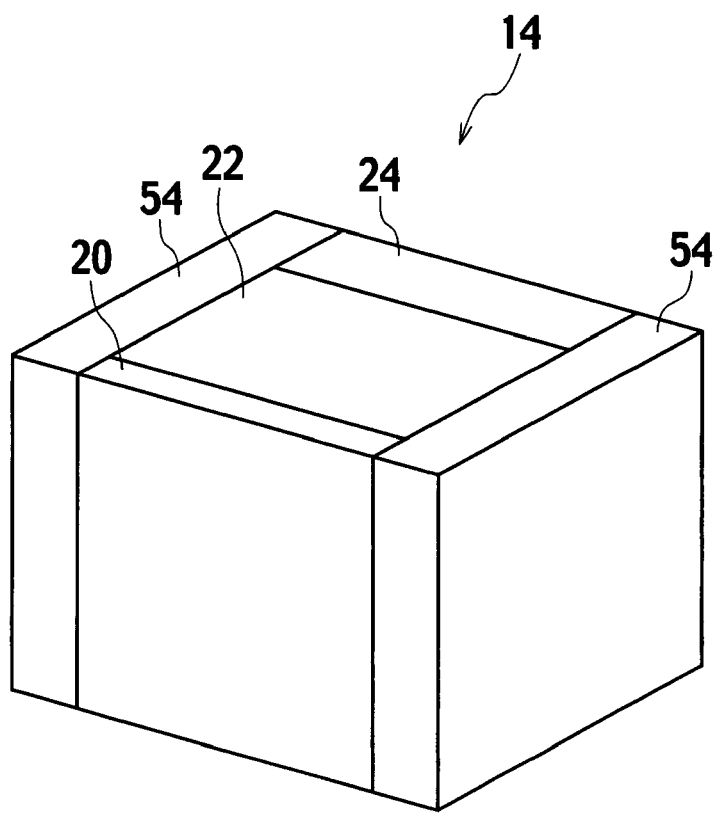
FIG. 13 is a perspective view showing another example of an fluorescent element according to the embodiment of the present invention.

Additionally, it is possible to provide directivity to the visible output light by limiting an extraction surface of the visible output light. As shown in FIG. 13, when the extraction surface is limited to the top surface of the luminescent film 22, reflection films 54 are provided on the opposite side surfaces of the fluorescent element 14. The visible light radiated in all directions in the luminescent film 22 is reflected from the reflection films 54. Thus, the visible light is emitted only from the top surface of the luminescent film 22.

Figure 14:
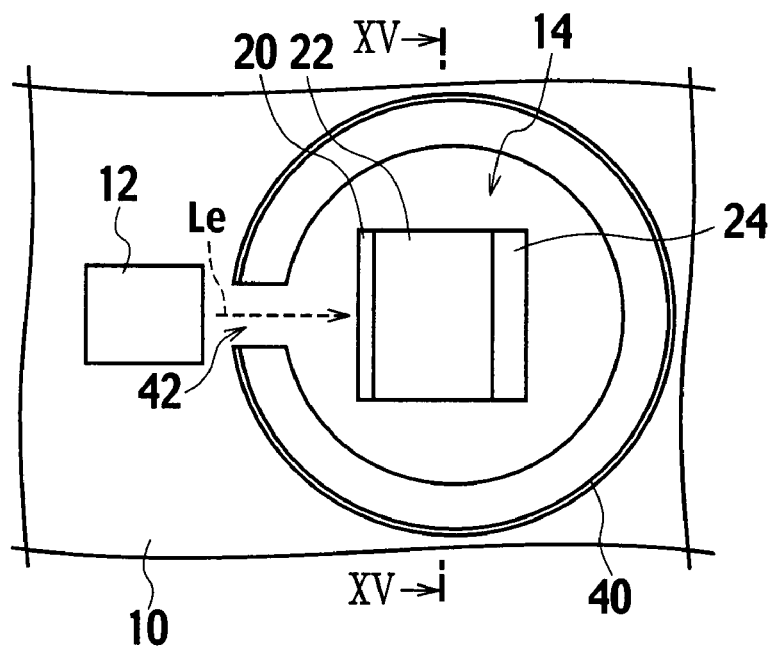
FIG. 14 is a cross sectional view showing another example of a light emitting device according to the embodiment of the present invention.
Figure 15:
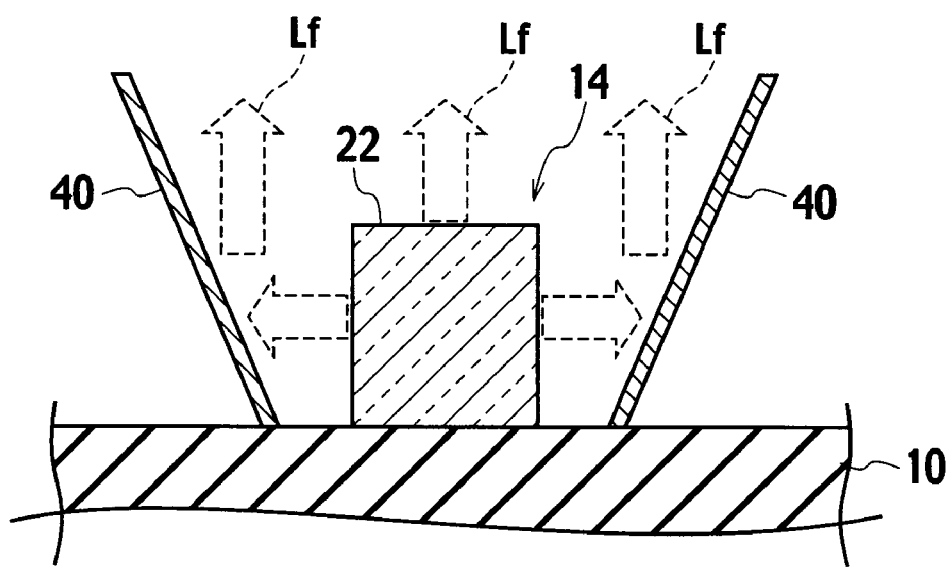
FIG. 15 is a cross sectional view taken on line XV-XV of the light emitting device shown in FIG. 14.

Furthermore, as shown in FIGS. 14 and 15, a reflecting mirror 40 may be provided on the mounting substrate 10 so as to surround the fluorescent element 14. The excitation light Le of the light emitting element 12 enters the fluorescent element 14 through an opening 42 of the reflecting mirror 40. The reflecting mirror 40 is slanted such that the visible output light Lf can be extracted upwardly from the surface of the mounting substrate 10. The visible output light Lf from the side of the luminescent film 22 is reflected by the reflecting mirror 40 and upwardly emitted similarly as the visible output light Lf from the top surface of the luminescent film 22. In addition, a parabolic reflecting mirror may be used as the reflecting mirror 40. In this way, it is possible to efficiently extract the highly directional visible output light Lf.

Figure 16:
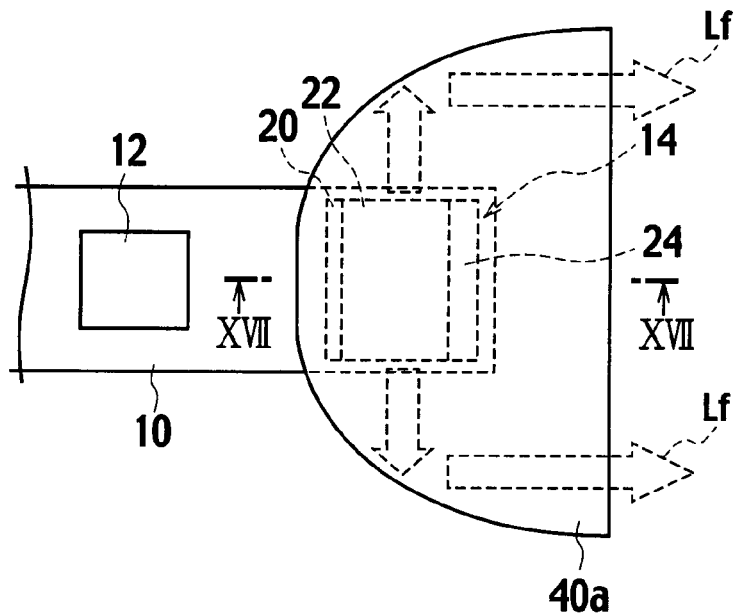
FIG. 16 is a plan view showing another example of a light emitting device according to the embodiment of the present invention.
Figure 17:
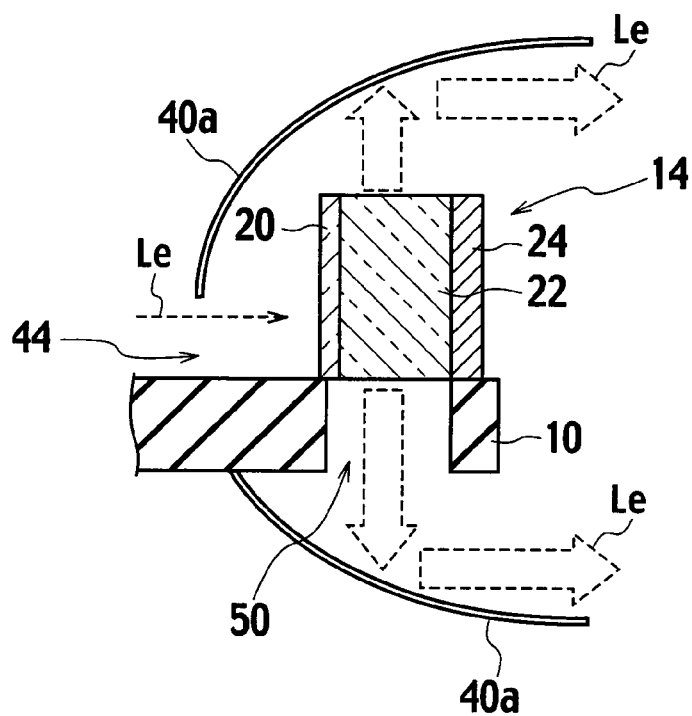
FIG. 17 is a cross sectional view taken on line XVII-XVII of the light emitting device shown in FIG. 16.

Furthermore, as shown in FIGS. 16 and 17, a parabolic reflecting mirror 40a, which emits the visible output light Lf in the incident direction of the excitation light Le, may be provided. The excitation light Le of the light emitting element 12 enters the fluorescent element 14 from an opening 44 formed in the reflecting mirror 40a. The visible output lights Lf emitted from the top surface and side surfaces of the fluorescent element 14 are reflected by the reflecting mirror 40a and extracted in a direction towards the fluorescent element 14 from the light emitting element 12. Also, a through hole 50 may be provided in the mounting substrate 10, so as to extract the visible output light Lf from the bottom surface of the luminescent film 22. In this way, it is possible to efficiently extract the highly directional visible output light Lf.

Figure 18:
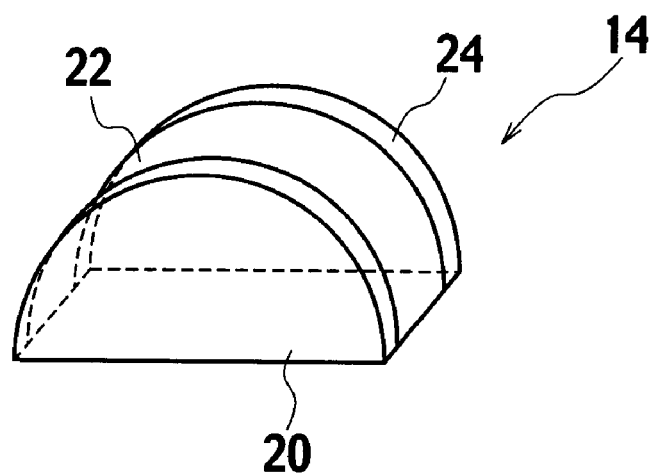
FIG. 18 is a perspective view showing another example of an fluorescent element according to the embodiment of the present invention.
Figure 19:
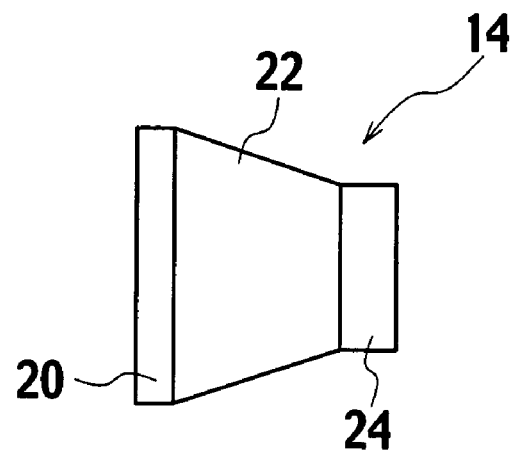
FIG. 19 is a plan view showing another example of an fluorescent element according to the embodiment of the present invention.

Furthermore, the shape of the fluorescent element 14 is not limited to a rectangular shape shown in FIGS. 1 and 2. As shown in FIG. 18, the fluorescent element 14 has a semicircular shape in a perpendicular cross section to the incident direction of the excitation light. Moreover, as shown in FIG. 19, the fluorescent element 14 has a trapezoidal shaped luminescent film 22 in which a width on a part near the semi-translucent film 20 is wider than on the other part near the reflection film 24. In this way, by providing the luminescent film 22 with a semicircular shape or a trapezoidal shape, it is possible to increase the extraction efficiency of the visible output light.

Figure 20:
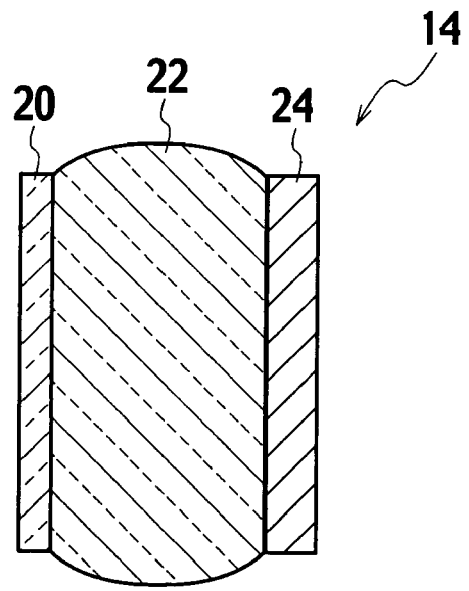
FIG. 20 is a cross sectional view showing another example of an fluorescent element according to the embodiment of the present invention.

Furthermore, in order to increase the extraction efficiency of the visible output light, as shown in FIG. 20, ends of the luminescent film 22 may be convexly rounded in a cross section along the incident direction of the excitation light.

Figure 21:
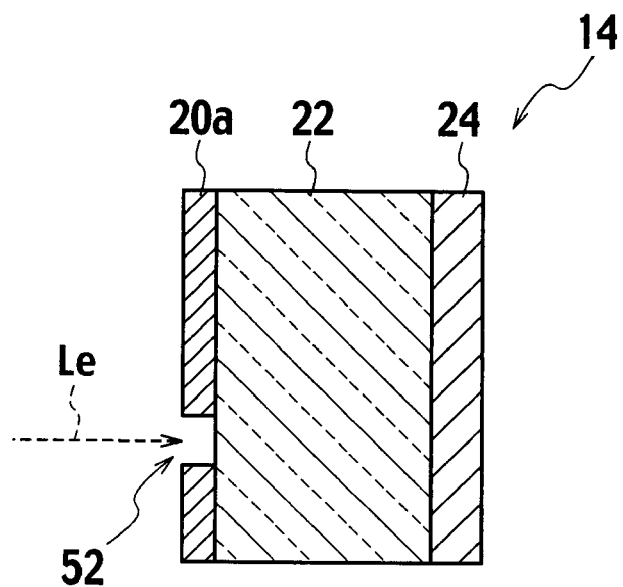
FIG. 21 is a cross sectional view showing another example of an fluorescent element according to the embodiment of the present invention.

Moreover, as shown in FIG. 21, an opening 52 may be provided in a semi-translucent film 20a. The excitation light Le can directly enter the luminescent film 22 from the opening 52. In this case, it is possible to use a dielectric multi-layer DBR having a wavelength selectivity, as the semi-translucent film 20a, in which the excitation light Le can be selectively reflected. Thus, it is possible to confine the incident excitation light inside the fluorescent element 14, and to increase the luminous efficiency.

(Modification)

Figure 22:
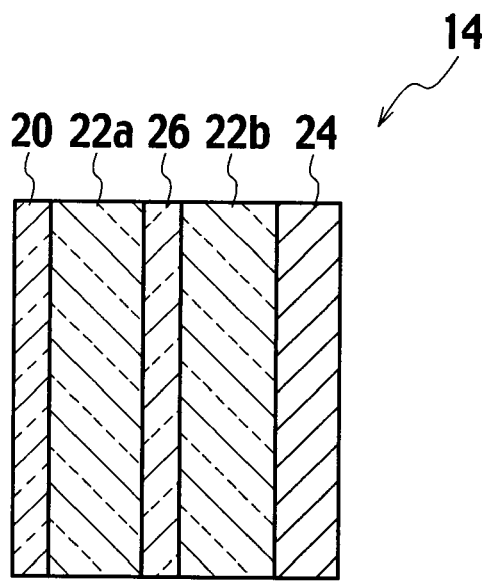
FIG. 22 is a cross sectional view showing an example of an fluorescent element according to a modification of the embodiment of the present invention.

A fluorescent element 14 according to a modification of the embodiment of the present invention includes a semi-translucent film 20, a first luminescent film 22a, a transparent film 26, a second luminescent film 22b and a reflection film 24, as shown in FIG. 22. The first and second luminescent films 22a, 22b include yellow and blue phosphor materials, respectively, which provide the while light by using the complementary color relationship. In addition, the optimal reflectivity of the semi-translucent film 20 can be determined from the relation between the thickness and reflectivity as shown in FIG. 5. Here, the thickness is a sum of the respective thicknesses of the luminescent films 22a, 22b.

The modification differs from the embodiment of the present invention in that the transparent film 26 is provided between the first and second luminescent films 22a, 22b. Other configurations are as in the embodiment of the present invention, so duplicated descriptions are omitted.

For the transparent film 26, a resin and the like, having an optical transparency, may be used. As the resin, it is possible to use any resin having a high optical transparency and heat resistance. For example, a silicon resin, an epoxy resin, a urea resin, a fluorine resin, an acryl resin, a polyimide resin and the like may be used. In particular, the epoxy resin or silicon resin is desirable because of ready availability, easy handiness and low cost. Also, other than resin, it is possible to use glass, a sintered body, ceramic structures, and the like, in which an oxide of Si, Ti and the like is a major constituent.

For example, when the first and second luminescent films 22a, 22b are disposed adjacent to each other, a color mixture may occur at the interface of the first and second luminescent films 22a, 22b. The blue visible light emitted from the second luminescent film 22b has a shorter wavelength than the yellow visible light emitted from the first luminescent film 22a. Thus, the blue visible light is absorbed in the first luminescent film 22a. As a result, the color tone of the output light may be changed and the luminous efficiency may be decreased.

In the modification of the embodiment of the present invention, the refractive index of the transparent film 26 is smaller than the first and second luminescent films 22a, 22b. For example, the yellow visible light emitted in the first luminescent film 22a is reflected at the interface of the transparent film 26, and it is difficult for the yellow light to enter the transparent film 26. Similarly, the blue visible light emitted in the second luminescent film 22b is reflected at the interface of the transparent film 26, and it is difficult for the blue light to enter the transparent film 26. As a result, color mixture between the first and second luminescent films 22a, 22b can be suppressed.

Furthermore, it is desirable to provide the second luminescent film 22b with a higher refractive index than the first luminescent film 22a. Since the difference of the refractive index between the second luminescent film 22b and the transparent film 26 is larger than between the first luminescent film 22a and the transparent film 26, it is possible to confine the blue visible light inside the second luminescent film 22b. The yellow visible light may not be absorbed even when the yellow visible light enters the second luminescent film 22b. As a result, it is possible to suppress the change of the color tone of the visible output light radiated from the fluorescent element 14. Moreover, since re-absorption of the blue visible light emitted in the second luminescent film 22b is decrease, it is possible to increase the light extraction efficiency. Thus, according to the modification of the embodiment of the present invention, it is possible to use safely the high energy excitation light and to radiate a high luminance visible light.

In addition, the foregoing explanation exemplifies the fluorescent element 14 having first and second luminescent films 22a, 22b. However, the luminescent films included in the fluorescent element 14 may be three or more. The transparent film may be provided between the respective luminescent films.

Figure 23:
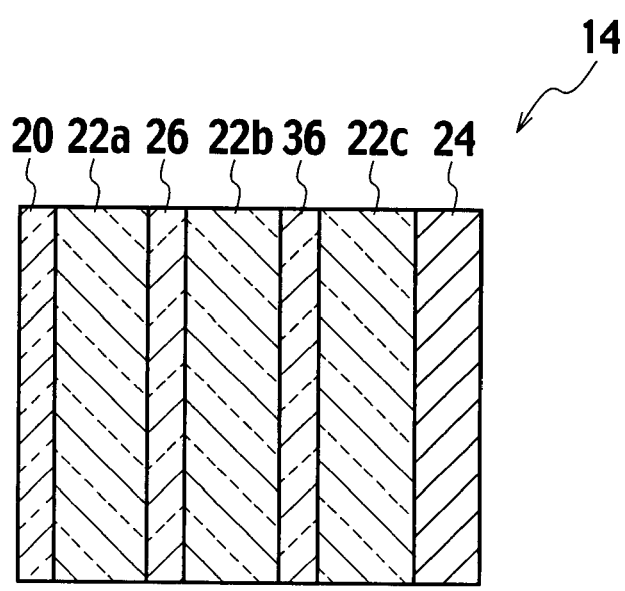
FIG. 23 is a cross sectional view showing another example of an fluorescent element according to the modification of the embodiment of the present invention.

For example, as shown in FIG. 23, each of a first luminescent film 22a, a second luminescent film 22b and a third luminescent film 22c includes a phosphor material of each color corresponding to each of RGB, which are the primary colors for providing a white light. A first transparent film 26 is disposed between the first and second luminescent films 22a, 22b. A second transparent film 36 is disposed between the second and third luminescent films 22b, 22c. The refractive index of the transparent film 26 is smaller than that of the first and second luminescent films 22a, 22b. The refractive index of the second transparent film 36 is smaller than that of the second and third luminescent films 22b, 22c. Thus, it is possible to suppress the color mixture between the visible lights of the RGB colors emitted from the first to third luminescent films 22a, 22b, 22c, respectively. As a result, it is possible to decrease the re-absorption of the blue and green visible lights, and to increase the light extraction efficiency.

Figure 24:
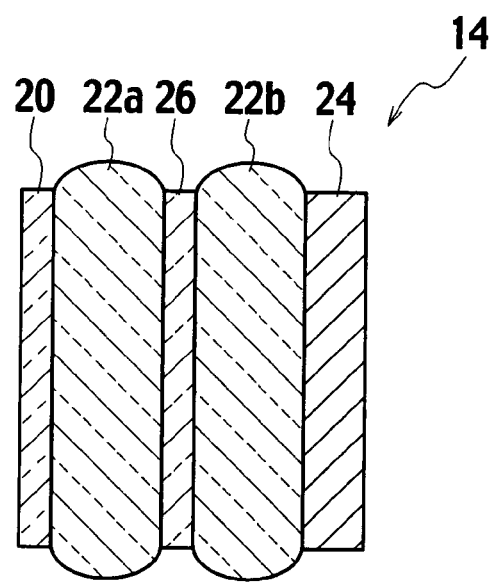
FIG. 24 is a cross sectional view showing another example of an fluorescent element according to the modification of the embodiment of the present invention.

Additionally, in order to increase the extraction efficiency of the visible output light, as shown in FIG. 24, ends of the first and second luminescent films 22a, 22b may be convexly rounded in a cross section along the incident direction of the excitation light.

Figure 25:
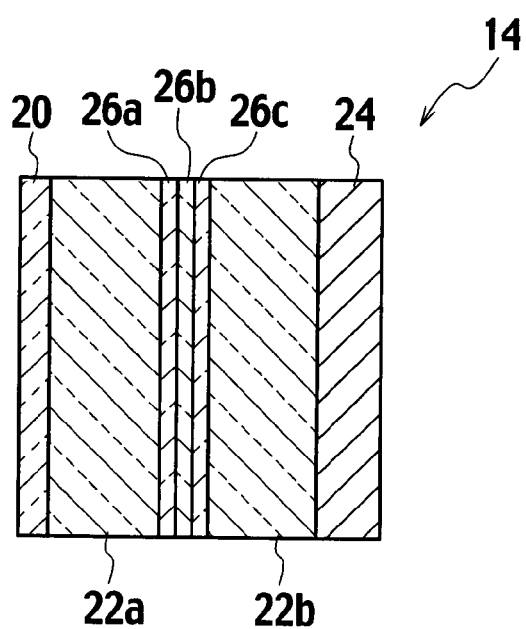
FIG. 25 is a cross sectional view showing another example of an fluorescent element according to the modification of the embodiment of the present invention.

Furthermore, the transparent film 26 may be a plurality of transparent films. As shown in FIG. 25, first to third transparent films 26a, 26b and 26c are disposed between the first and second luminescent films 22a, 22b. For example, the respective refractive indices of the first to third transparent films 26a, 26b, and 26c are smaller than those of the first and second luminescent films 22a, 22b. Also, the respective refractive indices of the first to third transparent films 26a, 26b, 26c are decreased from the first transparent film 26a, which is abutting the first luminescent film 22a having the yellow phosphors, to the third transparent film 26c, which is abutting the second luminescent film 22b having the blue phosphors. Moreover, the refractive index of the second luminescent film 22b is equal to or greater than that of the first luminescent film 22a.

The difference of the refractive index between the second luminescent film 22b and the third transparent film 26c is maximized. Thus, the blue visible light emitted in the second luminescent film 22b is reflected at the interface between the second luminescent film 22b and the third transparent film 26c, and it is difficult for the blue light to enter the first luminescent film 22a. As a result, it is possible to suppress the change in the color tone of the visible output light. Moreover, it is possible to decrease the re-absorption of the blue visible light emitted in the second luminescent film 22b and to increase the light extraction efficiency.

Also, each difference of the refractive indices between the respective adjacent films from the first luminescent film 22a to the third transparent film 26c is smaller than the difference of the refractive index between the first luminescent film 22a and the third transparent film 26c. Thus, the excitation light may be easily transmitted to the second luminescent film 22b. As a result, it is possible to increase the absorption of the excitation light in the first and second luminescent films 22a, 22b, and to increase the extraction efficiency.

Other Embodiments

In the embodiment of the present invention, a light emitting device using a fluorescent element emitting a white light is described. However, the fluorescent element is not so limited. A fluorescent element emitting a visible light other than white may be used. For example, a fluorescent element emitting a visible light, such as red, orange, yellow, yellowish green, green, bluish green, blue, violet, and white, can be used as intended purpose.

The light emitting device according to the embodiment of the present invention may be used in a general lighting apparatus, a business lighting apparatus, a backlight of a liquid crystal display for a television or personal computer, a light for a car, an auto bicycle, or a bicycle, and the like.

Various modifications will become possible for those skilled in the art after storing the teachings of the present disclosure without departing from the scope thereof.

What is claimed is:

1. A light emitting device, comprising:
   a light emitting element configured to emit an excitation light; and
   a fluorescent element including:
      a semi-translucent film facing the light emitting element, and configured to transmit the excitation light;
      a first luminescent film including a plurality of phosphors configured to absorb the excitation light transmitted through the semi-translucent film and to emit a visible light having a different wavelength than the excitation light; and
      a reflection film disposed on an opposite side of the first luminescent film on which the semi-translucent film is disposed, configured to reflect the excitation light transmitted through the first luminescent film towards the first luminescent film.

2. The light emitting device of claim 1, wherein the first luminescent film includes a transparent base material that is transparent for the excitation light, and the phosphors are dispersed in the transparent base material.

3. The light emitting device of claim 1, wherein the fluorescent element further includes a second luminescent film, which emits a visible light having a wavelength different from the first luminescent film.

4. The light emitting device of claim 3, wherein one of the first and second luminescent films, emitting the visible light having a shorter wavelength, has a larger refractive index than the other.

5. The light emitting device of claim 3, wherein the fluorescent element further includes a transparent film that is transparent for the excitation light, between the first and second luminescent films.

6. The light emitting device of claim 5, wherein the transparent film has a refractive index smaller than the refractive index of the first and second luminescent films at the wavelengths of the visible lights.

7. The light emitting device of claim 3, wherein one of the first and second luminescent films at a near side of the reflection film emits the visible light having a shorter wavelength.

8. The light emitting device of claim 1, wherein the phosphors includes a plurality of phosphor materials, which emit lights having different wavelengths from each other.

9. The light emitting device of claim 1, wherein the reflection film has a reflectivity of about eighty % or more for the excitation light.

10. The light emitting device of claim 1, wherein the reflection film comprises a metal film.

11. The light emitting device of claim 1, wherein the reflection film comprises a multi-layer distributed Bragg reflector selectively reflecting the excitation light.

12. The light emitting device of claim 1, wherein the semi-translucent film comprises a metal film or a dielectric multi-layer film.

13. The light emitting device of claim 1, wherein the semi-translucent film has an opening through which the excitation light can directly enter the first luminescent film.

14. The light emitting device of claim 1, wherein the light emitting element comprises a semiconductor light emitting element emitting a light having a spectrum with a peak wavelength of about 430 nm or less.

15. The light emitting device of claim 1, wherein the light emitting element comprises an edge emitting type semiconductor laser diode.

16. The light emitting device of claim 1, wherein the light emitting element comprises a surface emitting type semiconductor laser diode.

17. The light emitting device of claim 1, wherein the light emitting element has an active layer of a nitride based compound semiconductor including at least one of aluminum, gallium, and indium.

18. The light emitting device of claim 1, wherein the light emitting element has an active layer of an oxide semiconductor including at least one of magnesium and zinc.

19. The light emitting device of claim 3, wherein the fluorescent element further includes a third luminescent film, which emits a visible light having a wavelength different from the first and second luminescent films.

* * * * *